(12) United States Patent
Yonaha

(10) Patent No.: US 11,080,436 B2
(45) Date of Patent: Aug. 3, 2021

(54) PRODUCT DESIGN ASSISTANCE DEVICE AND PRODUCT DESIGN ASSISTANCE METHOD

(71) Applicant: FUJIFILM Corporation, Tokyo (JP)

(72) Inventor: Makoto Yonaha, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 372 days.

(21) Appl. No.: 16/032,189

(22) Filed: Jul. 11, 2018

(65) Prior Publication Data
US 2018/0322223 A1 Nov. 8, 2018

Related U.S. Application Data

(63) Continuation of application No. PCT/JP2016/083462, filed on Nov. 11, 2016.

(30) Foreign Application Priority Data

Feb. 10, 2016 (JP) .............................. JP2016-023813

(51) Int. Cl.
*G06F 30/00* (2020.01)
*G06Q 30/02* (2012.01)
(Continued)

(52) U.S. Cl.
CPC .............. *G06F 30/00* (2020.01); *G06F 16/00* (2019.01); *G06F 16/50* (2019.01); *G06F 17/18* (2013.01);
(Continued)

(58) Field of Classification Search
CPC .......... G06F 30/00; G06F 16/00; G06F 16/50; G06F 17/18; G06Q 10/06; G06Q 30/02;
(Continued)

(56) References Cited

U.S. PATENT DOCUMENTS 7,092,929 B1 * 8/2006 Dvorak ................ G06Q 10/087
705/28
9,152,624 B1 * 10/2015 Krallman ............ G06F 16/5866
(Continued)

FOREIGN PATENT DOCUMENTS

JP  H08-278959 A    10/1996
JP  2002288216   * 10/2002
(Continued)

OTHER PUBLICATIONS

Lee et al. "Development of a Fuzzy-Rule Based System for Product Development in the Garment Industry" 2015 Proceedings of PICMET (Sep. 2015) [retrieved on Sep. 11, 2020] (Year: 2015).*
(Continued)

*Primary Examiner* — Rehana Perveen
*Assistant Examiner* — Alfred H B Wechselberger
(74) *Attorney, Agent, or Firm* — Studebaker & Brackett PC

(57) ABSTRACT

A product design device includes a product database, a design feature amount acquisition unit, a search unit that searches for a first product having a first design feature amount similar to a second design feature amount from a product database and acquires information on a sales record of the first product that has been searched for, and an output unit that statistically processes product attribute information including at least one of the first design feature amount of the first product that has been searched for or the information on the sales record of the first product that has been searched for, and outputs the statistically processed product attribute information.

21 Claims, 15 Drawing Sheets

[PRODUCT DB]

| PRODUCT ID | CATEGORY | PRODUCT IMAGE | DESIGN FEATURE AMOUNT | | | | | | EC SITE (STORE) | BRAND | STOCK | SIZE | PRICE | NUMBER OF PRODUCTIONS | NUMBER OF SALES | NUMBER OF STOCK DISTRIBUTIONS | SALES STORE |
|---|---|---|---|---|---|---|---|---|---|---|---|---|---|---|---|---|---|
| | | | COLOR | PATTERN | SHAPE | TEXTURE | SENSITIVITY WORD | WEAVE | | | | | | | | | |
| AAA... | TOPS | 👕 | H=... S=... V=... | PATTERN SIZE... PATTERN DENSITY... | SHAPE OF COLLAR V NECK | DEGREE OF GLOSSINESS... DEGREE OF TRANSPARENCY... | CASUAL | WEAVE No. 23 | EC2 | COMPANY A | THREE REMAINING SETS | M | --- | 300 | 97 | STORE No. 2: 100 PIECES STORE No. 3: 100 PIECES STORE No. 4: 100 PIECES | STORE No. 2: 25 PIECES STORE No. 3: 25 PIECES STORE No. 4: 47 PIECES |
| BBB... | PANTS | 👖 | H=... S=... V=... | PATTERN SIZE... PATTERN DENSITY... | THINNESS/ THICKNESS | DEGREE OF GLOSSINESS... DEGREE OF TRANSPARENCY... | ELEGANT | WEAVE No. 40 | EC6 | COMPANY C | ONE REMAINING SET | FREE | --- | 300 | 99 | STORE No. 5: 100 PIECES STORE No. 6: 100 PIECES STORE No. 7: 100 PIECES | STORE No. 5: 49 PIECES STORE No. 6: 25 PIECES STORE No. 7: 25 PIECES |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

(51) Int. Cl.
*G06F 17/18* (2006.01)
*G06T 7/00* (2017.01)
*G06F 16/50* (2019.01)
*G06F 16/00* (2019.01)
*G06Q 10/06* (2012.01)

(52) U.S. Cl.
CPC ............ *G06Q 10/06* (2013.01); *G06Q 30/02* (2013.01); *G06Q 30/0201* (2013.01); *G06Q 30/0202* (2013.01); *G06T 7/0002* (2013.01)

(58) Field of Classification Search
CPC ............ G06Q 30/0202; G06Q 30/0201; G06T 7/0002
See application file for complete search history.

(56) References Cited

U.S. PATENT DOCUMENTS

| | | | | |
|---|---|---|---|---|
| 2005/0249414 | A1* | 11/2005 | Uehara | G06T 7/0004 382/181 |
| 2007/0053602 | A1* | 3/2007 | Kanatsu | H04N 19/162 382/244 |
| 2008/0144943 | A1* | 6/2008 | Gokturk | G06T 7/0002 382/224 |
| 2009/0043759 | A1* | 2/2009 | Danish | G06Q 30/0235 |
| 2010/0076819 | A1* | 3/2010 | Wannier | G06Q 30/0246 705/7.33 |
| 2011/0158535 | A1* | 6/2011 | Iio | G06K 9/4642 382/190 |
| 2011/0282757 | A1* | 11/2011 | Muckle, Jr. | G06Q 30/06 705/26.5 |
| 2013/0060786 | A1* | 3/2013 | Serrano | G06K 9/3258 707/749 |
| 2014/0254934 | A1* | 9/2014 | Laxminarayana Bhat | G06F 16/58 382/173 |
| 2014/0267301 | A1* | 9/2014 | Yang | G06T 11/206 345/467 |
| 2016/0171365 | A1* | 6/2016 | Stepanovskiy | G06N 20/00 706/9 |
| 2016/0189177 | A1* | 6/2016 | Parpia | G06Q 30/0202 705/7.31 |
| 2017/0091790 | A1* | 3/2017 | Ray | G06Q 10/087 |

FOREIGN PATENT DOCUMENTS

| | | | | |
|---|---|---|---|---|
| JP | 2003-162619 | A | 6/2003 | |
| JP | 2004-326520 | A | 11/2004 | |
| JP | 2004326520 | * | 11/2004 | ............ G06F 17/30 |
| JP | 2009-134611 | A | 6/2009 | |
| JP | 2009-181491 | A | 8/2009 | |
| JP | 2010277391 | * | 12/2010 | ............ G06F 17/30 |
| WO | 2004/093006 | A1 | 10/2004 | |
| WO | WO2016017241 | * | 2/2016 | ......... G06Q 30/0203 |

OTHER PUBLICATIONS

Thomassey et al. "A hybrid sales forecasting system based on clustering and decision trees" Decision Support Systems, vol. 42, pp. 408-421; DOI: 10.1015/j.dss.2005.01.008 [retrieved on Sep. 12, 2020] (Year: 2005).*

Uehara et al. "A Computer-aided Visual Exploration System for Knowledge Discovery from Images" Proceedings of the Second International Workshop on Multimedia Data Mining (MDM/KDD 2001), San Francisco, USA, pp. 102-109 [retrieved on Sep. 11, 2020]. (Year: 2001).*

Tsai. C. "Bag-of-Words Representation in Image Annotation: A Review" ISRN Artificial Intelligence, vol. 2012, Article ID 376804, 19 pages; doi:10.5402/2012/376804. Retrieved on Mar. 20, 2021. (Year: 2012).*

Ishida et al. "A Kansei Retrieval Method for Traditional Japanese Crafting Objects Based on Visual Pattern Image Coding" Proceedings of Keer 2007. Retrieved Mar. 19, 2021. (Year: 2007).*

International Search Report issued in PCT/JP2016/083462; dated Feb. 7, 2017.

Written Opinion issued in PCT/JP2016/083462; dated dated Feb. 7, 2017.

International Preliminary Report on Patentability issued in PCT/JP2016/083462; dated Aug. 17, 2017.

* cited by examiner

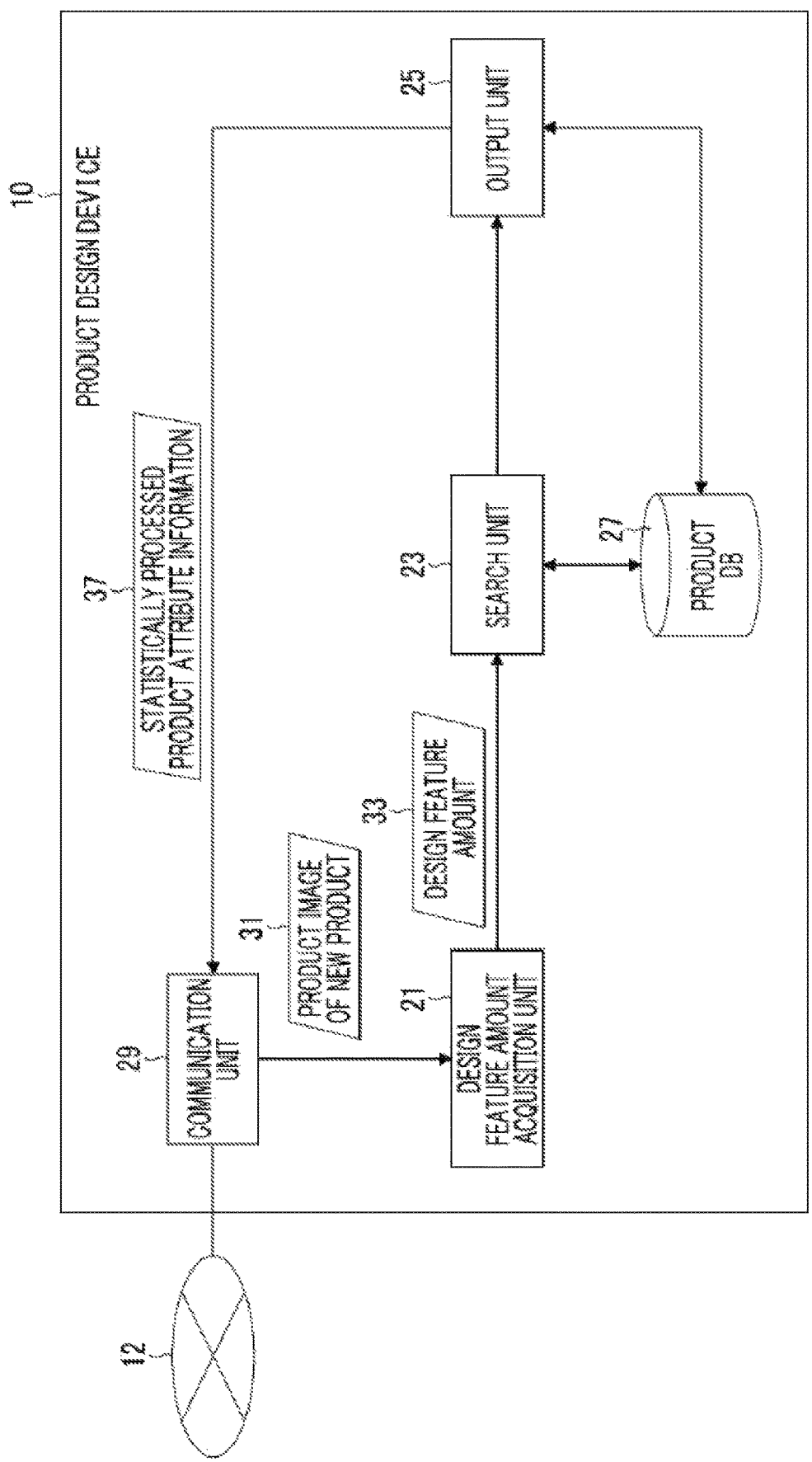

FIG. 5

[PRODUCT DB]

| PRODUCT ID | CATEGORY | PRODUCT IMAGE | DESIGN FEATURE AMOUNT ||||||| EC SITE (STORE) | BRAND | STOCK | SIZE | PRICE | NUMBER OF PRODUCTIONS | NUMBER OF SALES | NUMBER OF STOCK DISTRIBUTIONS | SALES STORE |
|---|---|---|---|---|---|---|---|---|---|---|---|---|---|---|---|---|---|---|
| | | | COLOR | PATTERN | SHAPE | TEXTURE | SENSITIVITY WORD | WEAVE | | | | | | | | | |
| AAA... | TOPS | (image) | H=... S=... V=... | PATTERN SIZE=... PATTERN DENSITY=... | SHAPE OF COLLAR V NECK | DEGREE OF GLOSSINESS=... DEGREE OF TRANSPARENCY=... | CASUAL | WEAVE No. 23 | EC2 | COMPANY A | THREE REMAINING SETS | M | ... | 300 | 97 | STORE No. 2: 100 PIECES STORE No. 3: 100 PIECES STORE No. 4: 100 PIECES | STORE No. 2: 25 PIECES STORE No. 3: 25 PIECES STORE No. 4: 47 PIECES |
| BBB... | PANTS | (image) | H=... S=... V=... | PATTERN SIZE=... PATTERN DENSITY=... | THINNESS/ THICKNESS | DEGREE OF GLOSSINESS=... DEGREE OF TRANSPARENCY=... | ELEGANT | WEAVE No. 40 | EC6 | COMPANY C | ONE REMAINING SET | FREE | ... | 300 | 99 | STORE No. 5: 100 PIECES STORE No. 6: 100 PIECES STORE No. 7: 100 PIECES | STORE No. 5: 49 PIECES STORE No. 6: 25 PIECES STORE No. 7: 25 PIECES |
| ... | ... | ... | ... | ... | ... | ... | ... | ... | ... | ... | ... | ... | ... | ... | ... | ... | ... |

| PRODUCT ID | DESIGN FEATURE AMOUNT | (VARIATION IN COLOR, NUMBER OF PRODUCTIONS, AND NUMBER OF SALES) | REMARKS |
|---|---|---|---|
| 0001 | PATTERN: No.1<br>SHAPE: No.2<br>WEAVE: No.2 | (COLOR PALETTE No. 45, 30 PIECES, 30 PIECES)<br>(COLOR PALETTE No. 27, 10 PIECES, 08 PIECES)<br>(COLOR PALETTE No. 96, 05 PIECES, 05 PIECES)<br>(COLOR PALETTE No. 24, 55 PIECES, 50 PIECES) | LIMITED TO THE SAME SEASON PERIOD ONE YEAR AGO |
| 0002 | PATTERN: No.2<br>SHAPE: No.3<br>WEAVE: No.2 | (COLOR PALETTE No. 15, 40 PIECES, 30 PIECES)<br>(COLOR PALETTE No. 23, 10 PIECES, 10 PIECES)<br>(COLOR PALETTE No. 97, 05 PIECES, 05 PIECES)<br>(COLOR PALETTE No. 38, 65 PIECES, 55 PIECES) | LIMITED TO THE SAME SEASON PERIOD ONE YEAR AGO |
| ... | ... | ... | ... |

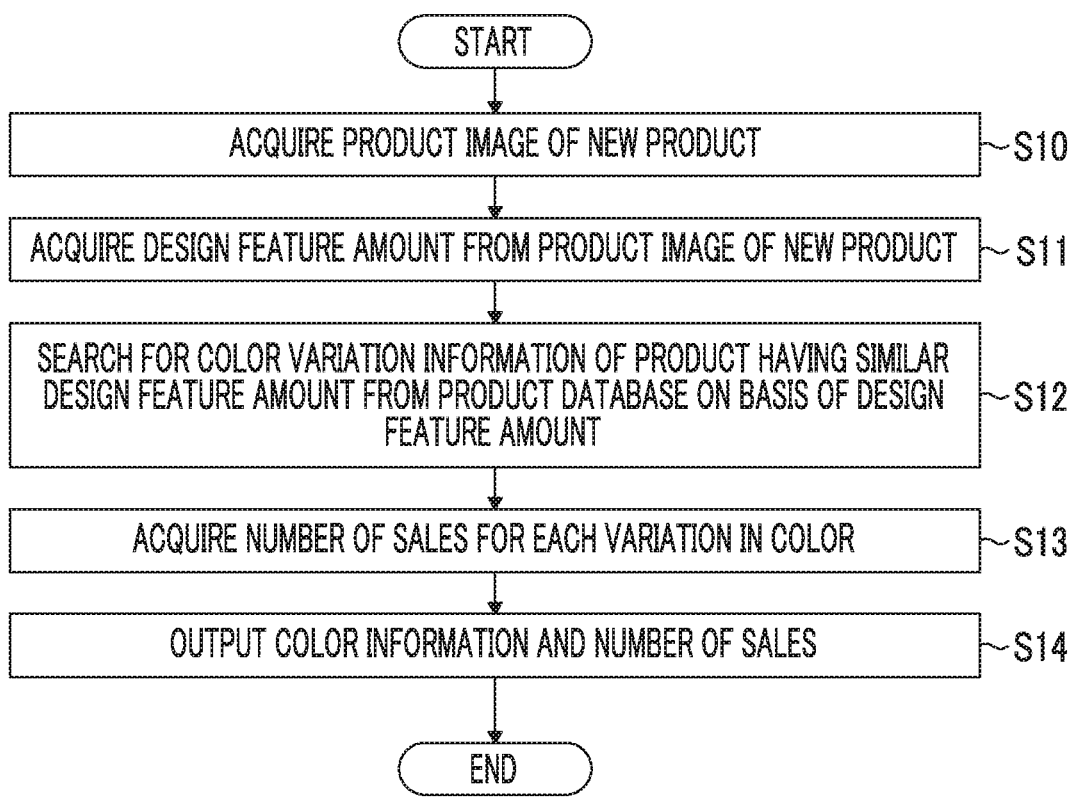

FIG. 12

| PRODUCT ID | DESIGN FEATURE AMOUNT | (STORE, NUMBER OF STOCK DISTRIBUTIONS, AND NUMBER OF SALES) | REMARKS |
|---|---|---|---|
| 0001 | COLOR PALETTE No.10<br>PATTERN : No.2<br>SHAPE : No.2<br>TEXTURE : No.2 | (STORE No. 25, 20 PIECES, 20 PIECES)<br>(STORE No. 77, 20 PIECES, 18 PIECES)<br>(STORE No. 36, 10 PIECES, 05 PIECES)<br>(STORE No. 94, 50 PIECES, 50 PIECES) | LIMITED TO THE SAME SEASON PERIOD ONE YEAR AGO |
| 0002 | COLOR PALETTE No.8<br>PATTERN : No.1<br>SHAPE : No.2<br>TEXTURE : No.2 | (STORE No. 15, 40 PIECES, 30 PIECES)<br>(STORE No. 23, 10 PIECES, 10 PIECES)<br>(STORE No. 97, 05 PIECES, 05 PIECES)<br>(STORE No. 38, 65 PIECES, 55 PIECES) | LIMITED TO THE SAME SEASON PERIOD ONE YEAR AGO |
| ... | ... | ... | ... |

FIG. 17

| PRODUCT ID | DESIGN FEATURE AMOUNT | (PATTERN, NUMBER OF STOCK DISTRIBUTIONS, AND NUMBER OF SALES) | REMARKS |
|---|---|---|---|
| 0001 | COLOR PALETTE No.10<br>SHAPE : No.2<br>TEXTURE : No.2 | (PATTERN No. 25, 20 PIECES, 20 PIECES)<br>(PATTERN No. 77, 20 PIECES, 18 PIECES)<br>(PATTERN No. 36, 10 PIECES, 05 PIECES)<br>(PATTERN No. 94, 50 PIECES, 50 PIECES) | LIMITED TO THE SAME SEASON PERIOD ONE YEAR AGO |
| 0002 | COLOR PALETTE No.8<br>SHAPE : No.3<br>TEXTURE : No.2 | (PATTERN No. 15, 40 PIECES, 30 PIECES)<br>(PATTERN No. 23, 10 PIECES, 10 PIECES)<br>(PATTERN No. 97, 05 PIECES, 05 PIECES)<br>(PATTERN No. 38, 65 PIECES, 55 PIECES) | LIMITED TO THE SAME SEASON PERIOD ONE YEAR AGO |
| .... | .... | .... | .... |

FIG. 18

| PRODUCT ID | DESIGN FEATURE AMOUNT | (SIZE, NUMBER OF STOCK DISTRIBUTIONS, AND NUMBER OF SALES) | REMARKS |
|---|---|---|---|
| 0001 | COLOR PALETTE No.10<br>PATTERN : No.2<br>SHAPE : No.2<br>TEXTURE : No.2 | (SIZE No. 5, 20 PIECES, 20 PIECES)<br>(SIZE No. 7, 20 PIECES, 18 PIECES)<br>(SIZE No. 6, 10 PIECES, 05 PIECES)<br>(SIZE No. 4, 50 PIECES, 50 PIECES) | LIMITED TO THE SAME SEASON PERIOD ONE YEAR AGO |
| 0002 | COLOR PALETTE No.8<br>PATTERN : No.1<br>SHAPE : No.2<br>TEXTURE : No.2 | (SIZE No. 5, 40 PIECES, 30 PIECES)<br>(SIZE No. 3, 10 PIECES, 10 PIECES)<br>(SIZE No. 7, 05 PIECES, 05 PIECES)<br>(SIZE No. 8, 65 PIECES, 55 PIECES) | LIMITED TO THE SAME SEASON PERIOD ONE YEAR AGO |
| ... | ... | ... | ... |

FIG. 19

| PRODUCT ID | DESIGN FEATURE AMOUNT | (WEAVE, NUMBER OF STOCK DISTRIBUTIONS, AND NUMBER OF SALES) | REMARKS |
|---|---|---|---|
| 0001 | COLOR PALETTE No.10<br>PATTERN : No.2<br>SHAPE : No.2<br>TEXTURE : No.2 | (WEAVE No. 25, 20 PIECES, 20 PIECES)<br>(WEAVE No. 77, 20 PIECES, 18 PIECES)<br>(WEAVE No. 36, 10 PIECES, 05 PIECES)<br>(WEAVE No. 94, 50 PIECES, 50 PIECES) | LIMITED TO THE SAME SEASON PERIOD ONE YEAR AGO |
| 0002 | COLOR PALETTE No.8<br>PATTERN : No.1<br>SHAPE : No.2<br>TEXTURE : No.2 | (WEAVE No. 15, 40 PIECES, 30 PIECES)<br>(WEAVE No. 23, 10 PIECES, 10 PIECES)<br>(WEAVE No. 97, 05 PIECES, 05 PIECES)<br>(WEAVE No. 38, 65 PIECES, 55 PIECES) | LIMITED TO THE SAME SEASON PERIOD ONE YEAR AGO |
| ... | ... | ... | ... |

PRODUCT DESIGN ASSISTANCE DEVICE AND PRODUCT DESIGN ASSISTANCE METHOD

CROSS REFERENCE TO RELATED APPLICATIONS

This application is a Continuation of PCT International Application No. PCT/JP2016/083462 filed on Nov. 11, 2016, which claims priority under 35 U.S.C § 119(a) to Patent Application No. 2016-023813 filed in Japan on Feb. 10, 2016, all of which are hereby expressly incorporated by reference into the present application.

BACKGROUND OF THE INVENTION

1. Field of the Invention

The present invention relates to a product design device and a product design method, and more particularly, to a product design device and a product design method for assistance in various designs of new products using sales record of existing products that have already been sold.

2. Description of the Related Art

In the related art, a technology of predicting sales of newly developed products using sales record of existing products is known.

For example, JP2004-326520A discloses a technology for performing prediction of sales of a new product by accumulating existing design image information on existing products and marketing information corresponding to existing products in association with each other as existing design information, extracting existing design information associated with existing design image information closest to new design image information on a new product from the accumulated existing design information, and using the existing design information.

SUMMARY OF THE INVENTION

Here, in a case where a new product is developed, it is difficult to predict a demand of consumers since there is no information on the past sales record in the new product, and disadvantages are caused in a case where there is a difference between various designs of the new product and the demand of the consumers.

For example, in a case where a basic form of a design of a new product is completed and design of a variation in a color is performed, a bad stock occurs in a case where a large number of new unsold colored products are produced, and a loss of sales opportunity such as out-of-stock occurs in a case where a small number of new sold colored products are produced. Further, for example, in a case where a design of distribution of new products to respective consuming areas (regions or stores) is performed, a loss of a bad stock and a loss of a sales opportunity occur as described above in a case where a prediction regarding a demand at the consuming area is erroneous.

It can be said that the same applies to other design matters regarding new products. For example, a bad stock and a loss of a sales opportunity are likely to occur, as described above, in a design of a variation in a pattern of a new product, a design of a variation in a size, or a design of a variation in a weave (fabric).

However, JP2004-326520A mentions prediction of sales of the new product using marketing information of existing products similar to the new product, but does not mention assisting in a design of the new product. In addition, JP2004-326520A does not mention statistical processing of information such as a sales record of existing products and presenting of the resultant information for assistance in various designs of the new product.

The present invention has been made in view of the above circumstances, and an object thereof is to provide a product design device and a product design method capable of performing a design such that a consumer demand and a producer supply match in a case where various designs of new products are performed.

In order to achieve the above object, a product design device according to an aspect of the present invention is a product design device, comprising: a product database in which a first design feature amount obtained by analyzing a first product image indicating a first product for each first product which has already been commercialized and information on a sales record of the first product are registered in association with each other; a design feature amount acquisition unit that analyzes a second product image indicating a second product developed as a new product to acquire a second design feature amount of the second product; a search unit that searches for the first product having the first design feature amount similar to the second design feature amount from the product database and acquires the information on the sales record of the first product that has been searched for; and an output unit that statistically processes product attribute information including at least one of the first design feature amount of the first product that has been searched for or the information on the sales record of the first product that has been searched for, and outputs the statistically processed product attribute information.

According to this aspect, the design feature amount obtained from the product image of the product (the first product) that has already been commercialized and the sales record of the product that has already been commercialized are registered in association with each other in the product database. Further, according to the aspect, the existing product (the first product) having the design feature amount similar to the design feature amount of the new product (the second product) is searched for and the product attribute information of the existing product that has been searched for is statistically processed and output. Accordingly, according to the aspect, it is possible to assist in various designs of the new product in which a demand of a consumer matches a supply of a producer on the basis of the output statistically processed product attribute information.

Preferably, the output unit statistically processes the number of sales of the first product for each color of the first product and outputs a color with which the second product is to be produced or a proportion of the color with which the second product is to be produced.

According to this aspect, the number of sales for each color of the product that has already been commercialized is statistically processed, and the color to be produced or a proportion of the color to be produced in the new product is output by the output unit. Accordingly, according to the aspect, a design with which a producer supplies a variation in a color of a new product matching a demand of consumers is assisted.

Preferably, the output unit statistically processes the number of sales of the first product for each sales store of the first product and outputs a store to which the second product is to be delivered or a proportion of delivery to the store to which the second product is to be delivered.

According to this aspect, the number of sales of the existing product is statistically processed for each sales store of the product that has been commercialized, and the store to which the new product is to be delivered or a proportion of delivery to the store to which the new product is to be delivered is output by the output unit. Accordingly, according to the aspect, a delivery design in which occurrence of bad stocks in new products and a loss of a sales opportunity are curtailed is assisted.

Preferably, the output unit statistically processes the number of sales of the first product for each pattern of the first product and outputs a pattern with which the second product is to be produced or a proportion of the pattern with which the second product is to be produced.

According to this aspect, the number of sales of the existing product is statistically processed for each pattern of the existing product and the pattern with which the new product is to be produced or the proportion of the pattern with which the new product is to be produced is output by the output unit. Accordingly, in this aspect, it is possible to assist in a design of a variation in the pattern of the new product in which a demand of consumers matches a supply of a producer.

Preferably, the output unit statistically processes the number of sales of the first product for each size of the first product and outputs a size with which the second product is to be produced or a proportion of the size with which the second product is to be produced.

According to this aspect, the number of sales of the existing product is statistically processed for each size of the existing product and a size with which the new product is to be produced or a proportion of the size with which the new product is to be produced is output by the output unit. Accordingly, in this aspect, it is possible to assist in a design of a variation in the size of the new product in which a demand of consumers matches a supply of a producer.

Preferably, the output unit statistically processes the number of sales of the first product for each weave of the first product and outputs a weave with which the second product is to be produced or a proportion of the weave with which the second product is to be produced.

According to this aspect, the number of sales of the existing product is statistically processed for each weave of the existing product and a weave with which the new product is to be produced or a proportion of the weave with which the new product is to be produced is output by the output unit. Accordingly, in this aspect, it is possible to assist in a design of a variation in the weave of the new product in which a demand of consumers matches a supply of a producer.

Preferably, the first design feature amount and the second design feature amount include at least one of a color, a pattern, a shape, or a texture.

According to this aspect, since the design feature amount includes at least one of the color, the pattern, the shape, or the texture, search for the existing product that is similar in design to the new product is performed with high accuracy, and a more accurate assistance in various designs can be performed.

Preferably, the information on the sales record of the first product relates to the same past season as a sales season scheduled for the second product.

According to this aspect, since a sales record in the same past season as a sales season scheduled for the new product is used for information on the sales record of the existing product, it is possible to assist in various designs with higher accuracy.

Preferably, the search unit searches for a plurality of first products having the first design feature amount similar to the second design feature amount from the product database, and acquires the information on the sales record of the plurality of first products that have been searched for, and the output unit statistically processes product attribute information including at least one of the first design feature amount of the plurality of first products that have been searched for or information on the sales record of the plurality of first products that have been searched for, and outputs the statistically processed product attribute information.

According to this aspect, the product attribute information is statistically processed on the basis of the information on the sales record of the plurality of existing products similar to the new product and is output. Accordingly, in the aspect, a tendency of the sales record of the existing products similar to the new product is recognized, and various designs of the new product can be assisted so that there is no further omission.

A product design method according to another aspect of the present invention is a product design method in which a product database in which a first design feature amount obtained by analyzing a first product image indicating a first product for each first product which has already been commercialized and information on a sales record of the first product are registered in association with each other is used, the product design method comprising steps of: analyzing a second product image indicating a second product developed as a new product to acquire a second design feature amount of the second product; searching for the first product having the first design feature amount similar to the second design feature amount from the product database and acquiring the information on the sales record of the first product that has been searched for; and statistically processing product attribute information including at least one of the first design feature amount of the first product that has been searched for or the information on the sales record of the first product that has been searched for, and outputting the statistically processed product attribute information.

According to the present invention, since the design feature amount obtained from the product image of the product that has already been commercialized and the sales record of the product that has already been commercialized are registered in association with each other in the product database, the product having the design feature amount similar to the design feature amount of the new product is searched for, and the product attribute information of the existing product that has been searched for is statistically processed and output, it is possible to assist in various designs of the new product in which a demand of a consumer matches a supply of a producer on the basis of the output statistically processed product attribute information.

BRIEF DESCRIPTION OF THE DRAWINGS

FIG. 4 is a diagram illustrating functional blocks of a product design device.

FIG. 5 is a table showing an example of a storage configuration of a product database.

FIG. 6 is a diagram illustrating a language image scale showing sensitivity words arranged in a sensitivity space.

FIG. 8 is a diagram illustrating an example of statistically processed product attribute information.

FIG. 11 is an operation flow diagram of a product design device.

FIG. 12 is a diagram illustrating an example of statistically processed product attribute information.

FIG. 17 is a diagram illustrating an example of statistically processed product attribute information.

FIG. 18 is a diagram illustrating an example of statistically processed product attribute information.

FIG. 19 is a diagram illustrating an example of statistically processed product attribute information.

DESCRIPTION OF THE PREFERRED EMBODIMENTS

Hereinafter, embodiments of a product design device and a product design method of the present invention will be described with reference to the accompanying drawings. In the following embodiments, examples of a new product and an existing product of a "suit" will be described, but a target of the product of the present invention are not limited to the suit, and the present invention is also applied to any other product. Further, in an example which will be described below, a "first product" is described as an "existing product" and a "second product" described as a "new product", and therefore, a "first product image" is a "product image of an existing product", and a "second product image" is a "product image of a new product". Further, a "first design feature amount" is a "design feature amount of the existing product", and a "second design feature amount" is a "design feature amount of the new product".

Here, the existing product (a product which has already been commercialized) is a product that has been commercialized and already sold. Further, the new product is a newly developed product or a product that is newly being developed and, for example, the new product also includes a candidate for a new product and a sample at a product planning stage. Further, as the new product, a change in size, a change in a small logo, or the like is not a target of the new product.

Figure 1:
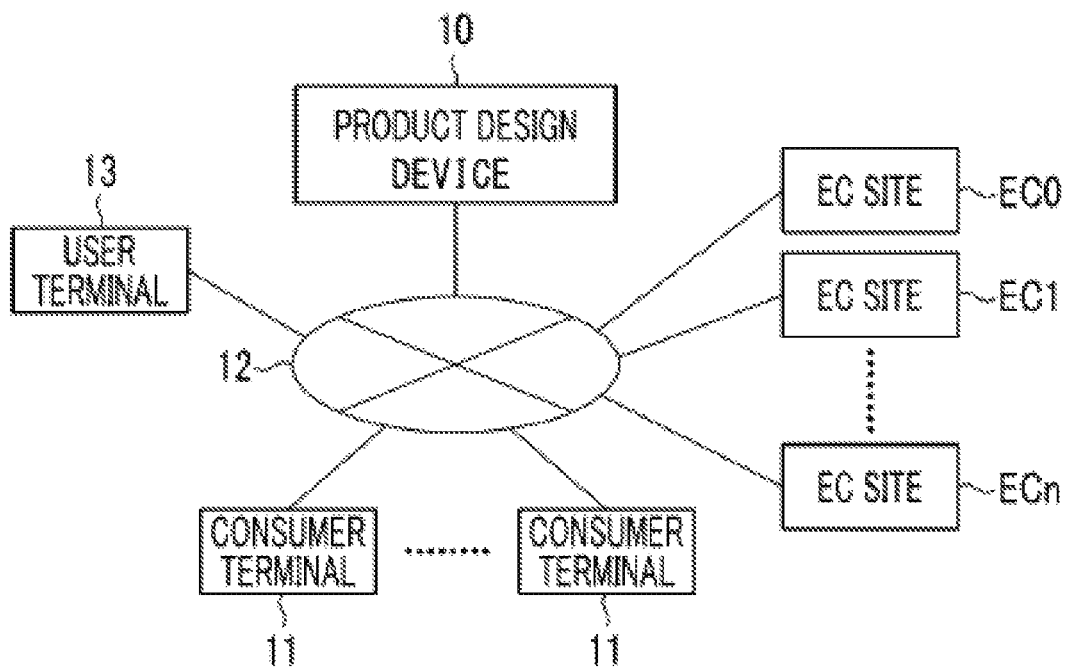
FIG. 1 is a conceptual diagram illustrating an example of a use form of a product design device.

FIG. 1 is a conceptual diagram illustrating an example of a use form of a product design device of the present invention. In the illustrated use form, a product design device 10, a plurality of consumer terminals 11, and a plurality of electronic commerce sites (EC sites) EC0 to ECn are connected via a network 12 such as the Internet.

The product design device 10 accumulates and stores a purchase history of products of the EC sites (EC0 to ECn) that consumers purchase using the consumer terminal 11 over the network 12, and a history of browsing or the like of products of the EC sites (EC0 to ECn) performed by the consumers using the consumer terminal 11. The product design device 10 can acquire the purchase history, the browsing history, and the like in the consumer terminal 11 using a known method. For example, the consumer terminal 11 searches for and purchases products handled by the EC sites (EC0 to ECn) via the product design device 10, and the product design device 10 acquires the purchase history and the browsing history of the consumer terminal 11.

The EC sites (EC0 to ECn) include a function of providing information on products (for example, product images, brands, stocks, prices, sizes, recommended products, and purchase information) to the user accessing the EC sites from the consumer terminal 11 via the product design device 10 or providing information on the products handled by the EC sites to a user accessing the EC sites without passing through the product design device 10.

The consumer terminal 11 is a terminal that is operated by a consumer in a case where the consumer searches for or purchases products such as a suit.

The user terminal 13 is a terminal that is used by a user of the product design device 10. The user of the product design device 10 is, for example, a person belonging to a new product development department of a suit production company. The user operates the user terminal 13 to receive assistance in a case where the user performs various designs of new products.

It should be noted that the consumer terminal 11 and the user terminal 13 are portable terminals such as smart phones or tablet devices, personal computers, or the like.

Next, the consumer terminal 11 and the user terminal 13 will be described. Since the consumer terminal 11 and the user terminal 13 have the same configuration, the user terminal 13 will mainly be described herein.

Figure 2:
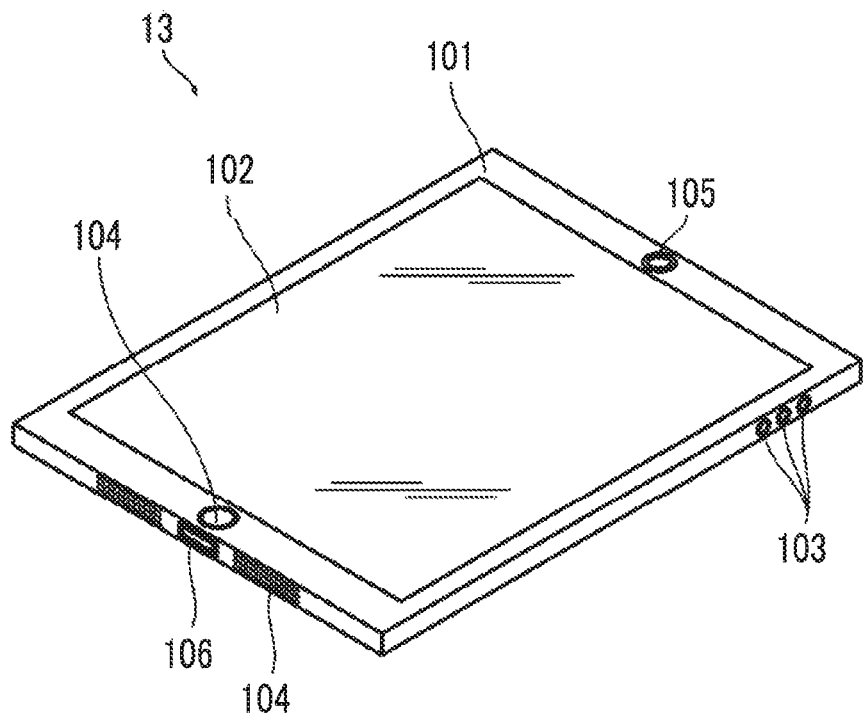
FIG. 2 is a perspective view illustrating an appearance configuration of a user terminal.

FIG. 2 is a perspective view illustrating an appearance configuration of the user terminal 13, and is a front perspective view.

As illustrated in FIG. 2, the user terminal 13 is configured of a tablet type computer. The user terminal 13 includes a flat casing 101 having a rectangular outline, and is configured to include a touch panel display 102 serving as both a display unit 126 (FIG. 3) and an input unit 128 (FIG. 3), an operation button 103, a speaker 104, a built-in camera 105, an external connection terminal 106, and the like in casing 101.

Figure 3:
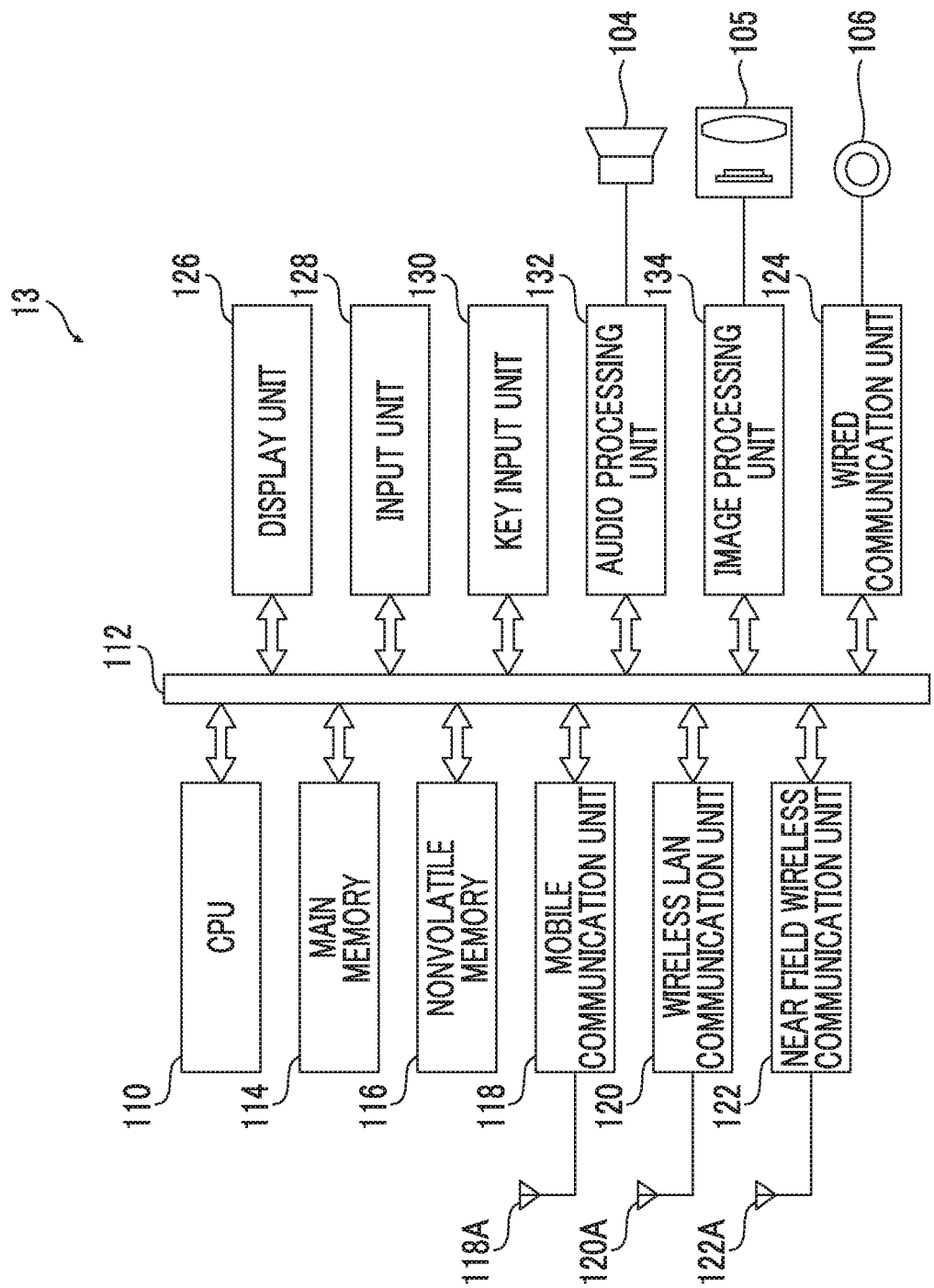
FIG. 3 is a block diagram illustrating a system configuration of a user terminal.

FIG. 3 is a block diagram illustrating a system configuration of the user terminal 13.

As illustrated in FIG. 3, the user terminal 13 includes a central processing unit (CPU) 110 that controls an overall operation of the user terminal 13, and is configured such that a main memory 114, a nonvolatile memory 116, a mobile communication unit 118, a wireless LAN (LAN: Local Area Network) communication unit 120, a near field wireless communication unit 122, a wired communication unit 124, a display unit 126, an input unit 128, a key input unit 130, an audio processing unit 132, an image processing unit 134, and the like are connected to the CPU 110 via a system bus 112.

The CPU 110 functions as a control unit that controls an operation of the entire computer by reading an operation program (an operating system (OS)), an application program that is operated on the OS, standard data, and the like stored in the nonvolatile memory 116, developing these in the main memory 114, and executing the operation program.

The main memory 114 is configured of, for example, a random access memory (RAM), and functions as a work memory of the CPU 110.

The nonvolatile memory 116 is configured of, for example, a flash EEPROM (Electrically Erasable Programmable Read Only Memory), and stores the above-described operation program and various types of standard data. Further, the nonvolatile memory 116 functions as a storage unit of the user terminal 13 and stores various types of data.

The mobile communication unit 118 executes transmission and reception of data to and from the nearest base station (not illustrated) via an antenna 118A on the basis of a third-generation mobile communication system conforming to the IMT-2000 standard (International Mobile Telecommunication-2000) and a fourth-generation mobile communication system conforming to the IMT-Advance standard (International Mobile Telecommunications-Advanced).

The wireless LAN communication unit 120 performs wireless LAN communication according to a predetermined wireless LAN communication standard (for example, an IEEE 802.11 a/b/g/n standard), with a wireless LAN access point or an external device capable of wireless LAN communication, via an antenna 120A.

The near field wireless communication unit 122 executes transmission and reception of data to and from, for example, another device conforming to a Bluetooth (registered trademark) standard that is in a range of Class 2 (within a radius of about 10 m) via the antenna 122A.

The wired communication unit 124 performs communication according to a predetermined communication standard with an external device connected using a cable via the external connection terminal 106. For example, universal serial bus (USB) communication is performed.

The display unit 126 includes a color LCD (LCD: Liquid Crystal Display) panel which constitutes a display portion of the touch panel display 102, and a driving circuit thereof, and displays various images.

The input unit 128 constitutes a touch panel portion of the touch panel display 102. The input unit 128 is configured integrally with the color LCD panel using transparent electrodes. The input unit 128 generates and outputs two-dimensional position coordinate information corresponding to a touch operation of a user.

The key input unit 130 includes a plurality of operation buttons 103 included in the casing 101 of the user terminal 13, and a driving circuit thereof.

The audio processing unit 132 converts digital audio data provided via the system bus 112 into an analog signal and outputs the analog signal from the speaker 104.

The image processing unit 134 digitizes an analog image signal output from the built-in camera 105 including an imaging lens and an image sensor, performs required signal processing on a resultant signal, and outputs the signal.

Next, the product design device 10 will be described.

FIG. 4 is a diagram illustrating functional blocks of the product design device 10. The product design device 10 mainly includes a design feature amount acquisition unit 21, a search unit 23, an output unit 25, a product database (described as a product DB in FIG. 4) 27, and a communication unit 29. The product design device 10 is configured of a general server or the like, and the design feature amount acquisition unit 21, the search unit 23, the output unit 25, the product database 27, and the communication unit 29 are controlled by one or a plurality of internal CPUs being operated. Further, the product database 27 is constructed on a recording medium such as a hard disk drive (HDD) using a known language such as SQL. It should be noted that the user terminal 13 and the consumer terminal 11 are connected to the network 12 in addition to the product design device 10 as described with reference to FIG. 1, but are omitted.

The design feature amount acquisition unit 21 acquires a design feature amount 33 of the new product by analyzing the new product image indicating the new product. That is, the design feature amount acquisition unit 21 acquires the design feature amount 33 of the new product by receiving a product image 31 of the new product obtained by imaging the new product and analyzing the input product image 31 of the new product. The design feature amount acquisition unit 21 can acquire the design feature amount 33 by performing image analysis of the product image 31 of the new product using a known technology. Specifically, the design feature amount acquisition unit 21 performs the image analysis using a discriminator obtained by a machine learning scheme such as SVM, Real Ada Boost, or Ada Boost, and a feature amount such as a wavelet feature amount, a Haar-like feature amount, an Edgelet feature amount, an EOH feature amount, or a HOG feature amount. Here, the design feature amount 33 is not particularly limited as long as the design feature amount 33 indicates a feature of a design of a product. For example, the design feature amount is, for example, at least one of a color, a pattern, a shape, or a texture of the product in the product image.

It should be noted that, although the example in which the design feature amount acquisition unit 21 acquires the design feature amount 33 from the new product image has been described, the present invention is not limited thereto. For example, the design feature amount acquisition unit 21 may acquire the design feature amount 33 obtained through the image analysis from the outside over the network 12.

The search unit 23 searches for an existing product having a design feature amount similar to the design feature amount 33 of the new product from the design feature amounts of the plurality of existing products registered in the product database 27. In addition, the search unit 23 acquires information on the sales record stored in association with the existing product that has been searched for. Here, the information on the sales record is, for example, the number of sales, the number of stops, sales stores, and the number of productions. The search unit 23 transmits a search result (information on the existing product that has been searched for and a sales record of the existing product that has been searched for) to the output unit 25.

The search unit 23 compares the design feature amount of the existing product registered in the product database 27 with the design feature amount 33 of the new product acquired by the design feature amount acquisition unit 21 and searches for the existing product registered in the product database 27 on the basis of a comparison result. For example, using a difference between the design feature amount 33 of the new product and the design feature amount of the existing product, the search unit 23 may search for an existing product having the smallest difference or an existing product having a difference equal to or less than a threshold value. Here, the threshold value is arbitrarily set, and may be determined according to a type of assistance of a design requested by the user, the number of search results, or the like. It should be noted that the threshold value may be decreased in a case where the number of products that have been searched for is large, and the threshold value may be increased in a case where no product is searched for, so that the search can be performed again.

In the product database 27, the design feature amount of the existing product obtained by analyzing an existing product image showing the existing product and information on the sales record of the existing product are registered in association for each existing product. The product database 27 will be described below in detail.

The output unit 25 statistically processes the product attribute information 37 including at least one of the design feature amount of the existing product searched for by the search unit 23 or the information on the sales record of the existing product that has been searched for, and outputs the statistically processed product attribute information 37. Here, the product attribute information 37 is information including design feature amounts such as a color, a pattern, a shape, a texture, a sensitivity word, and a weave, and information on the sales record. In addition, the product attribute information 37 includes information estimated on the basis of a statistical processing result. The output unit 25 outputs the product attribute information 37 statistically processed to be useful information for various designs of the new product. For the statistically processed product attribute information 37 output from the output unit 25, information of a type selected according to a user's instruction or preset is output. For example, in a case where the user instructs outputting of the product attribute information on a variation in a color via the input unit 128 of the user terminal 13, the output unit 25 outputs the product attribute information 37 statistically processed for the variation in a color according to the instruction.

It should be noted that the search unit 23 may search for a plurality of existing products having a design feature amount similar to the design feature amount 33 of the new product and acquire information on a sales record of the plurality of existing products. In this case, the output unit statistically processes the product attribute information 37 including at least one of the design feature amounts of the plurality of existing products that have been searched for or the information on the sales record of the plurality of existing products that have been searched for, and outputs the statistically processed product attribute information 37.

The communication unit 29 has an input function and an output function, and performs an input of various information to the product design device 10 and an output of information from the product design device 10. For example, the product image 31 of the new product is input from the network 12 to the communication unit 29, and the communication unit 29 transmits the input product image 31 of the new product to the design feature amount acquisition unit 21. Further, for example, the communication unit 29 receives the statistically processed product attribute information 37 from the output unit 25 and transmits the statistically processed product attribute information 37 to the user terminal 13 over the network 12.

Next, an example of a storage configuration in the product database 27 will be described.

As illustrated in FIG. 5, the product database 27 registers and manages information on products for each existing product. The product database 27 functions as a storage unit that stores category information of an existing product, image data of the existing product, a design feature amount (a physical measurement value such as a color feature amount, a pattern feature amount, a shape feature amount, and a texture feature amount, a sensitivity word, and a weave) obtained by analyzing an image of the existing product, site information indicating an EC site (a store), brand information, stock information, size (SML or free) information, price information, the number of productions, the number of sales, sales store information, and the number of stock distributions in association with each other using a product identification (ID) for specifying the existing product as a key. It should be noted that the number of stock distributions is the number of stock deliveries, and the number of stock distributions may be indicated by proportion (delivery proportion).

Here, the product ID is intended to uniquely specify the product. For example, a product (a clothing) having the same a color, a pattern, a shape, and a texture influencing an image thereof may be regarded as the same product and the same product ID may be imparted to the product, or the same product ID may be imparted to a product having a different color and the same pattern, shape, and texture.

The category information indicates categories of products (clothes), and is information including tops, pants, blouses, skirts, T-shirts, and dresses.

Information on the existing products registered in the product database 27 can be collected from EC sites, with the design feature amount excluded, and the design feature amount is acquired by the image analysis unit (not illustrated) of the product design device 10 analyzing image data of the product, and is imparted as a part of the product information.

In addition, the sensitivity word included in the design feature amount can be obtained on the basis of the physical measurement value obtained by analyzing the image data of the product.

Figure 6:
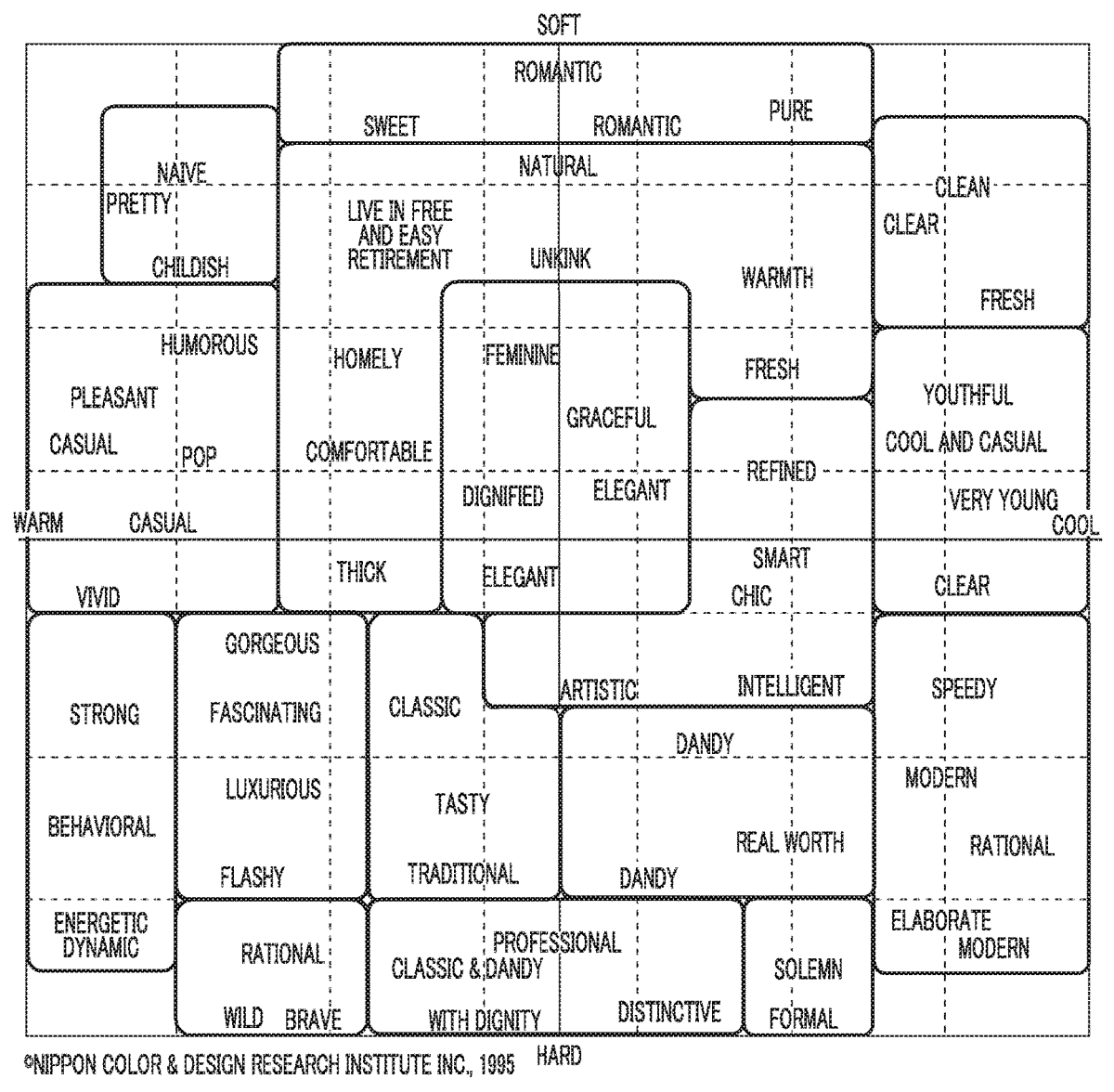
Figure 7:
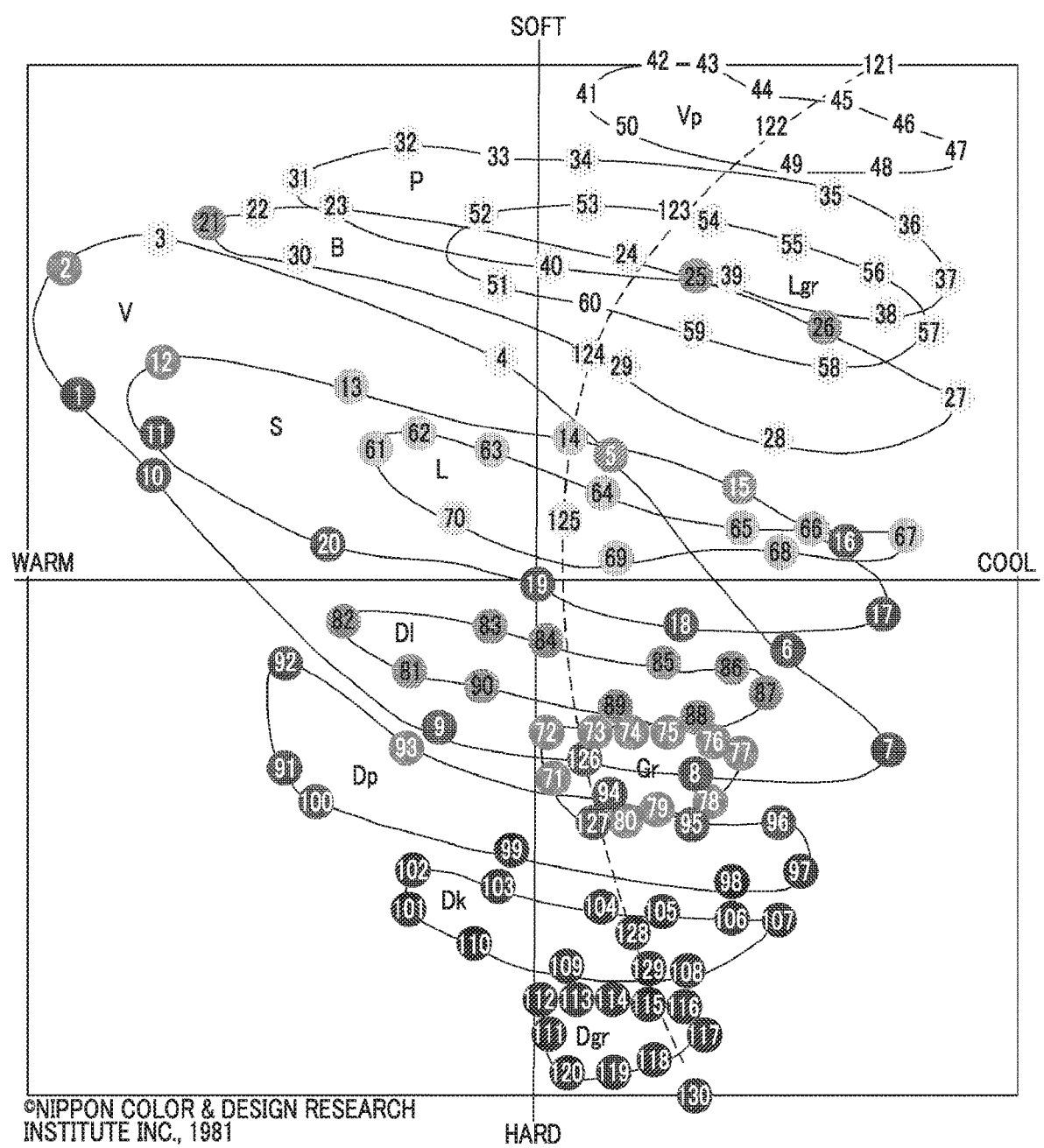
FIG. 7 is a diagram illustrating a single-color image scale of single colors (130 colors) arranged in the sensitivity space.

FIG. 6 is a language image scale showing sensitivity words arranged in a sensitivity space, and FIG. 7 is a single-color image scale of single colors (130 colors) arranged in the sensitivity space. It should be noted that the image scale illustrated in FIGS. 6 and 7 indicates an image scale disclosed from Nippon Color & Design Research Institute Inc. (see Shigenobu Kobayashi, "Color System" (Kodansha).

The sensitivity space illustrated in FIGS. 6 and 7 is a space defined by a horizontal axis indicating a degree of WARM/COOL and a vertical axis indicating a degree of HARD/SOFT.

In the language image scale illustrated in FIG. 6, 64 sensitivity words are arranged in the sensitivity space. Further, in the single-color image scale illustrated in FIG. 7, 130 single colors are arranged in the sensitivity space. Respective symbols illustrated in FIG. 7 indicate V (vivid), S (strong), B (bright), P (pale), Vp (berth•pale), Lgr (light grayish), L (light), Gr (grayish), Dl (dull), Dp (deep), Dk (dark), and Dgr (dark grayish). Further, as representative colors among the 130 colors indicated by numerals, 1 indicates red, 2 indicates orange, 3 indicates yellow, 4 indicates yellowish green, 5 indicates green, 6 indicates bluish green, 7 indicates blue, 8 indicates bluish purple, 9 indicates purple, and 10 indicates purplish red. In addition, 121 indicates white and 130 indicates black.

It is seen that there is a correlation between the sensitivity word and the physical measurement value (single color in the example of FIG. 7), as illustrated in FIGS. 6 and 7. Therefore, a conversion table or a conversion equation showing a relationship between the physical measurement value and the sensitivity word can be prepared in advance, an image of the product can be analyzed, the physical measurement value can be measured, and the measured physical measurement value can be converted into a sensitivity word using the conversion table or the like.

<First Example of Statistically Processed Product Attribute Information>

Next, a first example of the statistically processed product attribute information 37 output from the output unit 25 will be described. In this example, statistical processing is performed on the product attribute information of a variation in a color, the number of productions, and the number of sales.

FIG. 8 is a diagram illustrating an example of the statistically processed product attribute information 37. In the example illustrated in FIG. 8, statistical processing is performed on information on the variation in a color, the number of productions, and the number of sales with respect to product IDs "0001" and "0002". Here, the variation in a color is a design feature amount, and the number of productions and the number of sales are information on the sales record.

For a product with product ID "0001" and color palette No (number) 45, the number of productions is 30 and the number of sales is 30. For a product with color palette No 27, the number of productions is 10 and the number of sales is 8. For a product with color palette No 96, the number of productions is 5 and the number of sales is 5. For a product with color palette No 24, the number of productions is 55 and the number of sales is 50. It should be noted that, as described in remarks, the number of sales is information on sales record limited to the same season period one year ago as a sales season scheduled to sell a new product. In addition, the number of sales is not particularly limited as long as it is the same season in the past and may be the number of sales limited to the same season period of a plurality of years. Further, for product ID "0002", the product attribute information 37 is statistically processed as illustrated in FIG. 8, similar to product ID "0001". It should be noted that the color palette No uniquely indicates a color and is a number assigned to each color, and the color palette is a thumbnail display of the color palette.

It should be noted that the statistical processing in this application refers to numerical processing for quantitatively clarifying a distribution of information on the design feature amount and/or the sales record of an existing product having a design feature amount similar to that of the new product.

Figure 9:
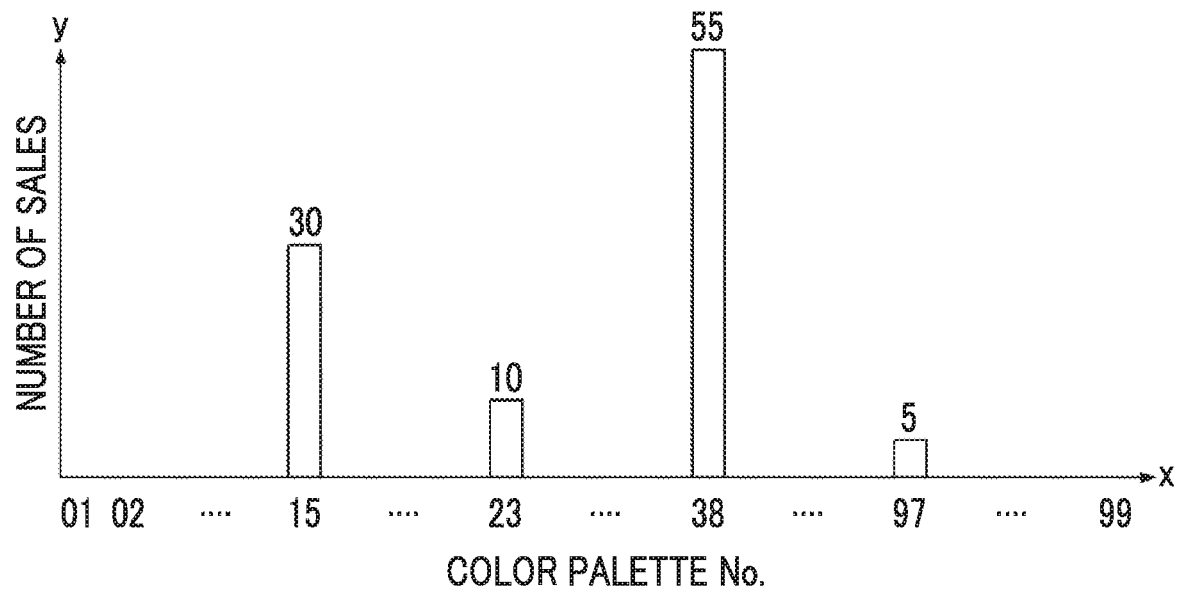
FIG. 9 is a diagram illustrating a display example of statistically processed product attribute information.
Figure 10:
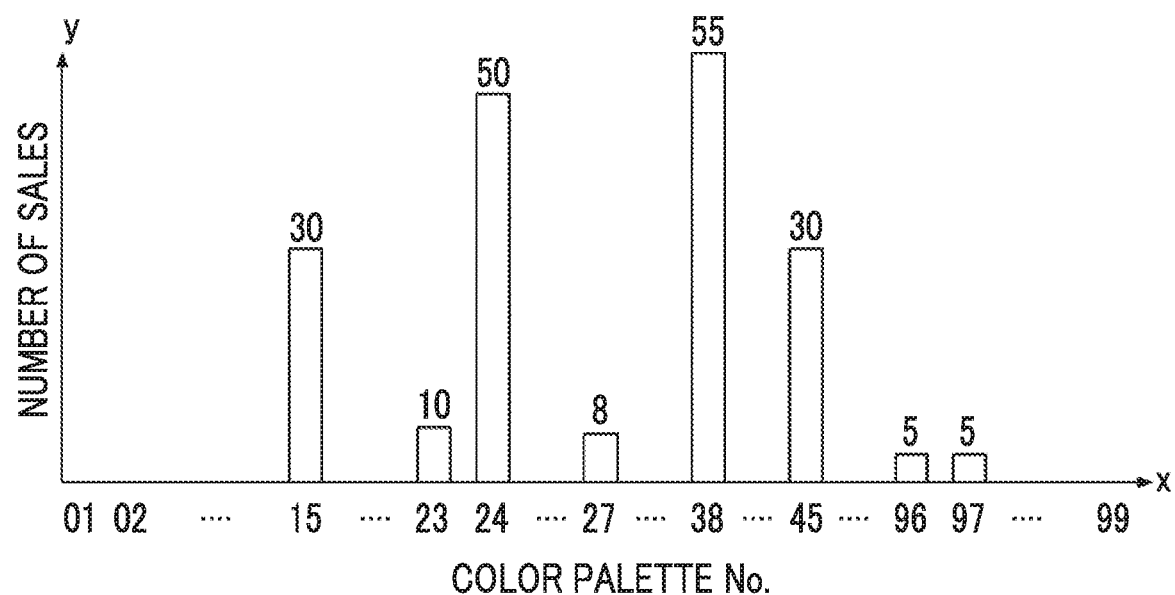
FIG. 10 is a diagram illustrating a display example of statistically processed product attribute information.

FIGS. 9 and 10 are diagrams illustrating display examples of the statistically processed product attribute information. For example, in the graphs illustrated in FIGS. 9 and 10, the number of sales is statistically processed for each color of existing products in the output unit 25, and a graph indicating color in which a new product is to be produced is displayed on the display unit 126 of the user terminal 13. In the graphs illustrated in FIGS. 9 and 10, an x-axis indicates a color palette No, and a y-axis indicates the number of sales.

In the graph illustrated in FIG. 9, the statistically processed product attribute information 37 is shown with respect to the existing product (product ID "0001"; see FIG. 8) having a design feature amount similar to a design feature amount of a new product. Specifically, it is shown that, for product ID "0001", 30 pieces of a product with color palette No 15 are sold, 10 pieces of a product with color palette No 23 are sold, 55 pieces of a product with color palette No 38 are sold, and five pieces of a product with color palette No 97 are sold. It should be noted that although the number of sales is shown in the above example, a proportion of the number of sales for each color palette No may be shown. Further, in this example, the example in which the statistically processed product attribute information 37 is graphed has been described, but the statistically processed product attribute information 37 is not limited to being graphed. For example, the statistically processed product attribute information 37 may be provided to the user as text information.

The user can perform a design so that the number of productions of color palette No 38 is increased, for example, in a case where the user designs the variation in a color of the new product, by obtaining the statistically processed product attribute information 37 of the color palette. That is, the user can perform a design of the color to be produced or a proportion of the color to be produced in the new product by obtaining the statistically processed information on the number of sales for each color palette.

Further, the graph illustrated in FIG. 10 is based on the statistically processed product attribute information 37 for a plurality of existing products (product IDs "0001" and "0002"; referring to FIG. 8) having a design feature amount similar to the design feature amount of the new product. Specifically, it is shown that 30 pieces of a product with color palette No 15 are sold, 10 pieces of a product with color palette No 23 are sold, 50 pieces of a product with color palette No 24 are sold, 8 pieces of a product with color palette No 27 are sold, 55 pieces of a product with color palette No 38 are sold, 30 pieces of a product with color palette No 45 are sold, five pieces of a product with color palette No 96 are sold, and five pieces of a product with color palette No 97 are sold.

The user can perform a design so that the number of productions of color palette No 24 and color palette No 38 for which a relatively large number of sales is estimated is increased, for example, in a case where the user designs a variation in a color of a new product, by obtaining such statistically processed product attribute information 37.

Next, an operation of the product design device 10 will be described. FIG. 11 is a diagram illustrating an operation flow of the product design device 10 and is an operation flow diagram in a case where the number of sales regarding a variation in a color is output.

First, the product design device 10 acquires the product image 31 of the new product via the communication unit 29 (step S10). For example, the user images the new product using the built-in camera 105 of the user terminal 13 and transmits the product image 31 of the new product to the product design device 10 over the network 12. The product design device 10 acquires the product image 31 of the new product via the communication unit 29 using the design feature amount acquisition unit 21.

Then, the design feature amount is acquired by analyzing the product image 31 of the new product using the design feature amount acquisition unit 21 (step S11). An existing product having a similar design feature amount and information on variation in a color of the existing product are searched for from the product database 27 by the search unit 23 on the basis of the design feature amount acquired by the design feature amount acquisition unit 21 (step S12), and the number of sales is acquired for each variation in a color (step S13). Thereafter, the output unit 25 receives a search result of the search unit 23, statistically processes the color variation information (for example, color palette No) and the number of sales for each variation in a color, and outputs statistically processed information (step S14). It should be noted that although the example in which the number of sales is acquired for each variation in a color has been described in the above-described example, the search unit 23 may acquire a proportion of the number of sales for each variation in a color.

Each configuration and function described above can be appropriately realized by any hardware, any software, or a combination of both. For example, the present invention can also be applied to a program causing a computer to execute the processing steps (processing procedures) described above, a computer-readable recording medium (non-tempo- <Second Example of Statistically Processed Product Attribute Information>

Next, a second example of the statistically processed product attribute information 37 output from the output unit 25 will be described. In this example, statistical processing is performed on product attribute information of a store, the number of stock distributions, and the number of sales.

FIG. 12 is a diagram illustrating an example of the statistically processed product attribute information 37. In the example illustrated in FIG. 12, information on store information (for example, store No), the number of stock distributions, and the number of sales are statistically processed with respect to product IDs "0001" and "0002". Here, the store information, the number of stock distributions, and the number of sales are information on sales record.

For the product with product ID "0001", 20 pieces are distributed to a store with store No 25 and 20 pieces are sold, 20 pieces are distributed to a store with store No 77 and 18 pieces are sold, 10 pieces are distributed to a store with store No 36 and 5 pieces are sold, and 50 pieces are distributed to a store with store No 94 and 50 pieces are sold. It should be noted that the number of sales is the number of sales limited to the same season period one year ago as a sales season scheduled to sell a new product. Further, the product attribute information 37 is statistically processed for product ID "0002" as illustrated in FIG. 12, similar to product ID "0001".

Figure 13:
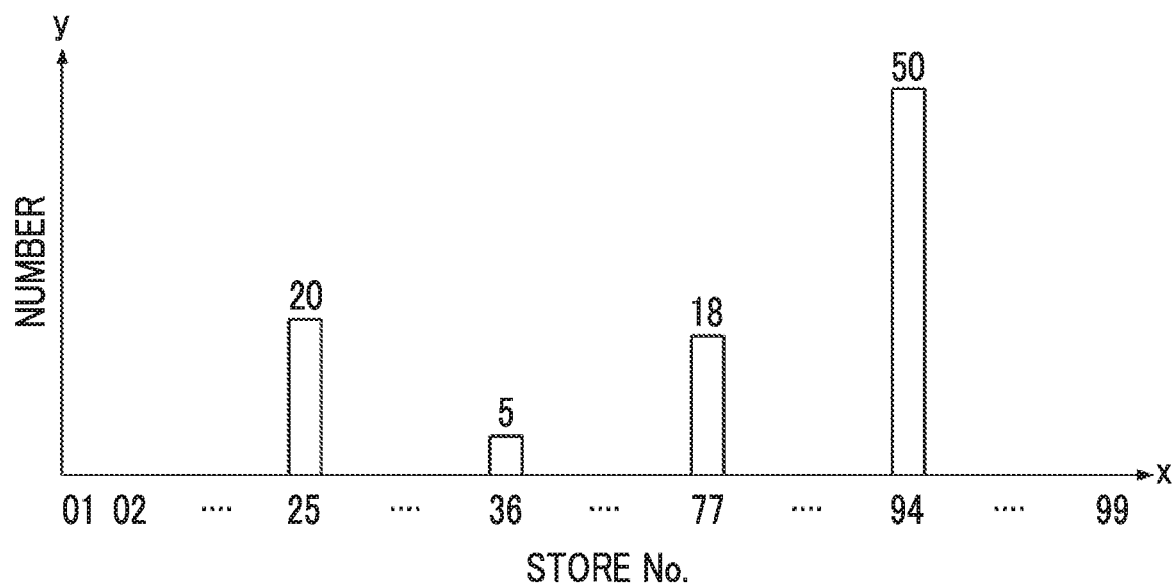
FIG. 13 is a diagram illustrating a display example of statistically processed product attribute information.
Figure 14:
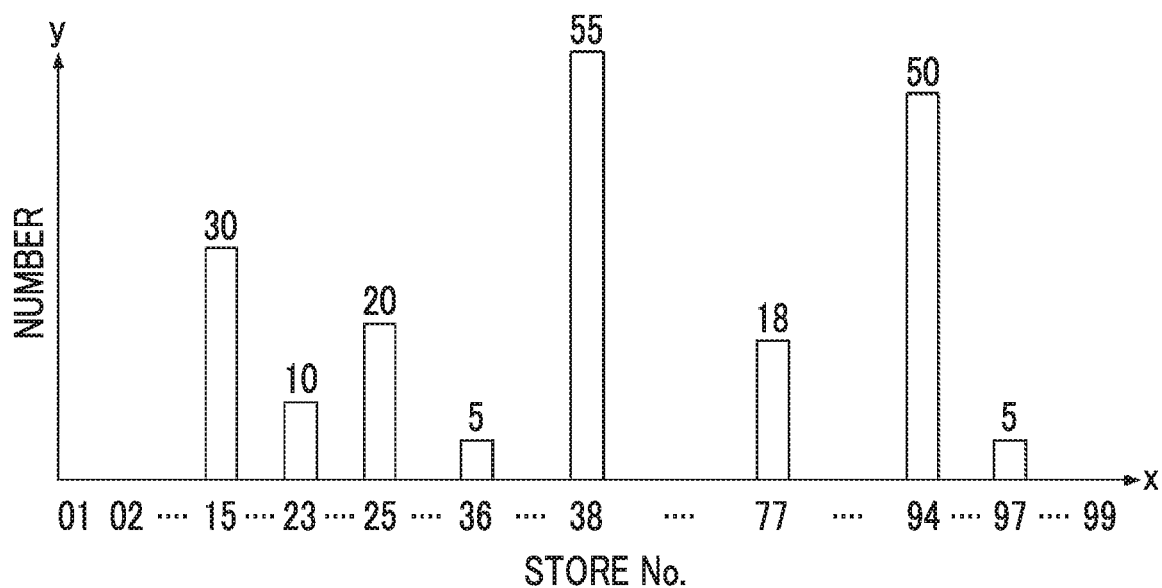
FIG. 14 is a diagram illustrating a display example of statistically processed product attribute information.
Figure 15:
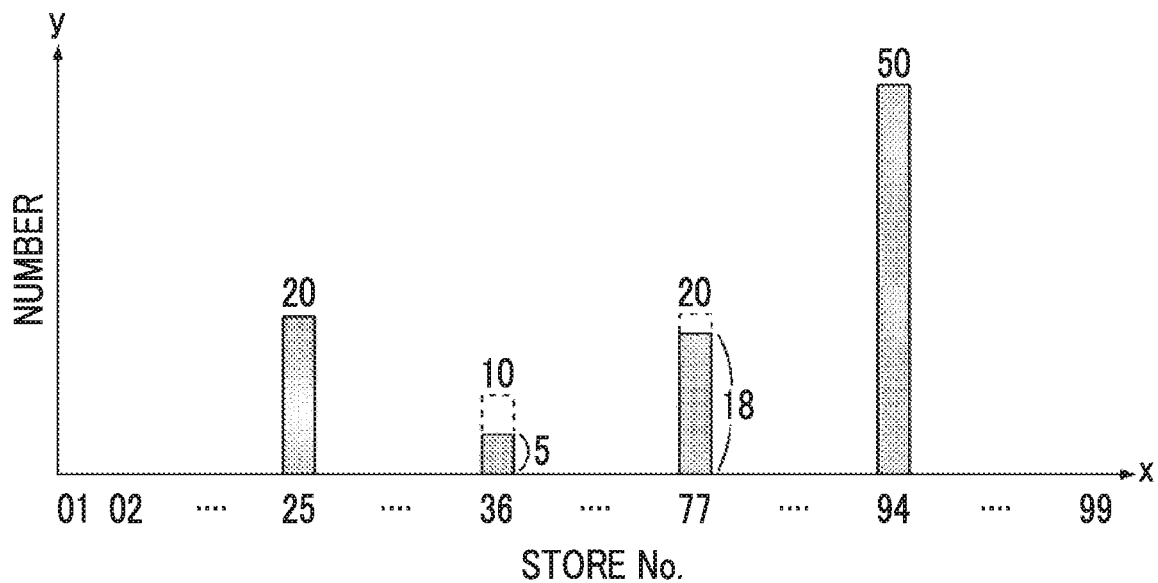
FIG. 15 is a diagram illustrating a display example of statistically processed product attribute information.

Graphs illustrated in FIGS. 13 to 15 are diagrams illustrating examples in a case where the statistically processed product attribute information 37 output from the output unit 25 is graphically displayed on the display unit 126 of the user terminal 13. That is, in the examples illustrated in FIGS. 13 to 15, the number of stock distributions and the number of sales are statistically processed for each sales store of the existing product in the output unit 25. In the graphs illustrated in FIGS. 13 to 15, an x-axis is store No and a y-axis is the number of products.

In the graph illustrated in FIG. 13, the statistically processed product attribute information 37 is graphed for an existing product (product ID "0001"; referring to FIG. 12) having a design feature amount similar to the design feature amount of the new product. Specifically, it is shown that for product ID "0001", 20 pieces were sold at store No 25, 5 pieces were sold at store No 36, 18 pieces were sold at store No 77, and 50 pieces were sold at store No 94.

Further, in the graph illustrated in FIG. 14, the statistically processed product attribute information 37 is graphed for a plurality of existing products (product IDs "0001" and "0002"; referring to FIG. 12) having a design feature amount similar to the design feature amount of the new product. Specifically, it is shown that for product IDs "0001" and "0002", 30 pieces were sold at store No 15, 10 pieces were sold at store No 23, 20 pieces were sold at store No 25, 5 pieces were sold at store No 36, 55 pieces were sold at store No 38, 18 pieces were sold at store No 77, 50 pieces were sold at store No 94, and 5 pieces were sold at store No 97.

In the graph illustrated in FIG. 15, the statistically processed product attribute information 37 is graphed for an existing product (product ID "0001"; referring to FIG. 12) having a design feature amount similar to the design feature amount of the new product. It should be noted that the graph illustrated in FIG. 15 is obtained by adding information on the number of stock distributions in the graph illustrated in FIG. 13. That is, in the diagram illustrated in FIG. 15, a bar graph shows the number of stock distributions, and a shaded area in the bar graph shows the number of sales.

The user can perform a design so that the number of deliveries or proportion of delivery of a store at which the relatively large number of sales can be expected is increased, for example, in a case where the user designs a store to which a new product is delivered and a proportion of delivery, by obtaining such statistically processed product attribute information 37 of store No and the number of sales.

Figure 16:
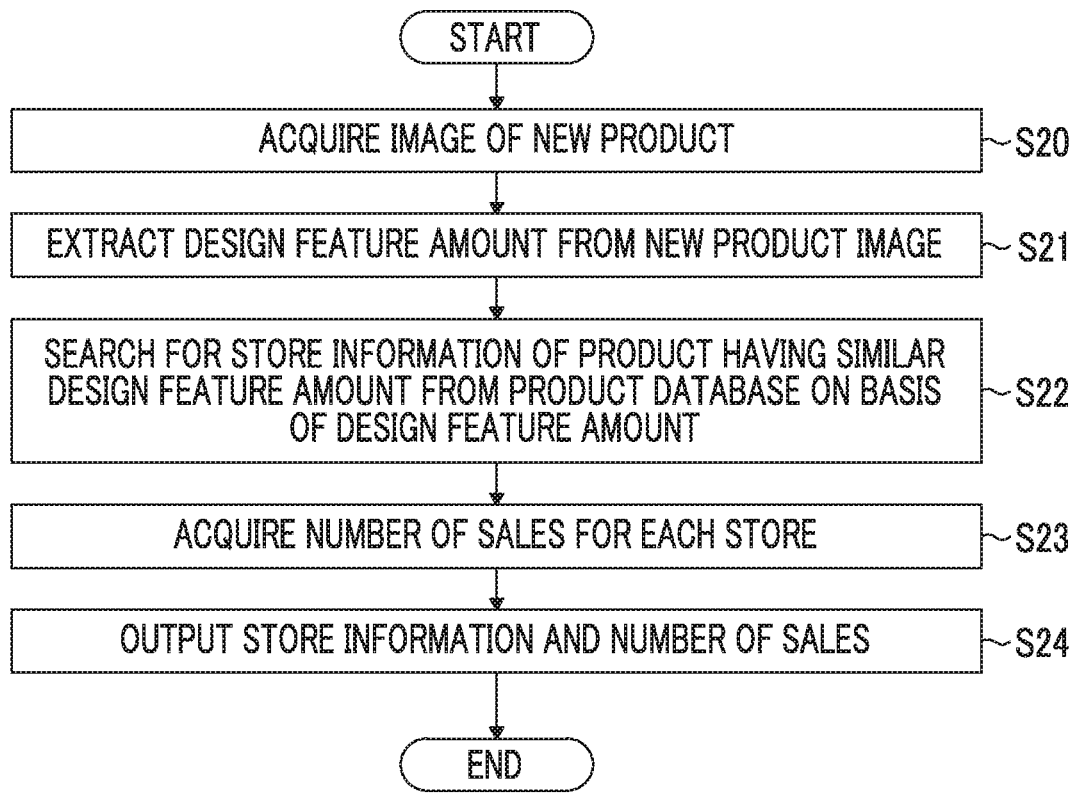
FIG. 16 is an operation flow diagram of a product design device.

Next, an operation of the product design device 10 will be described. FIG. 16 is a diagram illustrating an operation flow of the product design device 10, and is an operation flow diagram in a case where the number of sales in each store is output.

First, the product design device 10 acquires the product image 31 of the new product via the communication unit 29 (step S20). For example, the user images the new product using the built-in camera 105 of the user terminal 13 and transmits the product image 31 of the new product to the product design device 10 over the network 12. The product design device 10 acquires the product image 31 of the new product via the communication unit 29 using the design feature amount acquisition unit 21.

Then, the design feature amount is acquired by analyzing the product image 31 of the new product using the design feature amount acquisition unit 21 (step S21). An existing product having a similar design feature amount and store information of the existing product are searched for from the product database 27 by the search unit 23 on the basis of the design feature amount acquired by the design feature amount acquisition unit 21 (step S22), and the number of sales is acquired for each store (step S23). Thereafter, the output unit 25 receives a search result of the search unit 23, statistically processes the store information and the number of sales for each store, and outputs a result (step S24). It should be noted that although the example in which the number of sales is acquired for each store has been described in the above-described example, the search unit 23 may acquire a proportion of the number of sales for each store.

<Third Example of Statistically Processed Product Attribute Information>

Next, a third example of the statistically processed product attribute information 37 output from the output unit 25 will be described. In this example, statistical processing is performed on the product attribute information of patterns, the number of stock distributions, and the number of sales.

FIG. 17 is a diagram illustrating an example of the statistically processed product attribute information 37. In the example illustrated in FIG. 17, statistical processing is performed on information on the pattern, the number of stock distributions, and the number of sales with respect to product IDs "0001" and "0002". Here, the pattern is the design feature amount, and the number of stock distributions and the number of sales are information on the sales record.

For a product with product ID "0001" and pattern No 25, the number of stock distributions is 20 and the number of sales is 20. For a product with pattern No 77, the number of stock distributions is 20 and the number of sales is 18. For a product with pattern No 36, the number of stock distributions is 10 and the number of sales is 5. For a product with pattern No 94, the number of stock distributions is 50 and the number of sales is 50. It should be noted that, as described in remarks, the number of sales is the number of sales limited to the same season period one year ago as a sales season scheduled to sell a new product. It should be noted that pattern No indicates a unique pattern. Further, the product attribute information 37 is statistically processed for product ID "0002", similar to product ID "0001".

The user can refer to the pattern to be produced or a proportion of the pattern to be produced, for example, in a case where the user designs a variation in the pattern of the new product, by obtaining such statistically processed product attribute information 37 of the pattern and the number of sales.

<Fourth Example of Statistically Processed Product Attribute Information>

Next, a fourth example of the statistically processed product attribute information 37 output from the output unit 25 will be described. In this example, statistical processing is performed on the product attribute information of a size, the number of stock distributions, and the number of sales.

FIG. 18 is a diagram illustrating an example of the statistically processed product attribute information 37. In the example illustrated in FIG. 18, the information on the size, the number of stock distributions, and the number of sales is statistically processed with respect to product IDs "0001" and "0002". Here, the size is the design feature amount, and the number of stock distributions and the number of sales are information on the sales record.

For a product with product ID "0001" and size No 5, the number of stock distributions is 20 and the number of sales is 20. For a product with size No 7, the number of stock distributions is 20 and the number of sales is 18. For a product with size No 6, the number of stock distributions is 10 and the number of sales is 5. For a product with size No 4, the number of stock distributions is 50 and the number of sales is 50. It should be noted that, as described in remarks, the number of sales is the number of sales limited to the same season period one year ago as a sales season scheduled to sell a new product. It should be noted that size No indicates a unique size. Further, the product attribute information 37 is statistically processed for product ID "0002", similar to product ID "0001".

The user can refer to the size to be produced or a proportion of the size to be produced, for example, in a case where the user designs a variation in the size of the new product, by obtaining such statistically processed product attribute information 37 of the size and the number of sales.

<Fifth Example of Statistically Processed Product Attribute Information>

Next, a fifth example of the statistically processed product attribute information 37 output from the output unit 25 will be described. In this example, statistical processing is performed on product attribute information of a weave, the number of stock distributions, and the number of sales.

FIG. 19 is a diagram illustrating an example of the statistically processed product attribute information 37. In the example illustrated in FIG. 19, the information on the weave, the number of stock distributions, and the number of sales is statistically processed with respect to product IDs "0001" and "0002". Here, the weave is the design feature amount, and the number of stock distributions and the number of sales are information on the sales record.

For a product with product ID "0001" and weave No 25, the number of stock distributions is 20 and the number of sales is 20. For a product with weave No 77, the number of stock distributions is 20 and the number of sales is 18. For a product with weave No 36, the number of stock distributions is 10 and the number of sales is 5. For a product with weave No 94, the number of stock distributions is 50 and the number of sales is 50. It should be noted that, as described in remarks, the number of sales is the number of sales limited to the same season period one year ago as a sales season scheduled to sell a new product. It should be noted that weave No indicates a unique weave. Further, the product attribute information 37 is statistically processed for product ID "0002", similar to product ID "0001".

The user can refer to the weave to be produced or a proportion of the weave to be produced, for example, in a case where the user designs a variation in the size of the new product, by obtaining such statistically processed product attribute information 37 of the weave and the number of sales.

Although the examples of the present invention have been described, it is apparent that the present invention is not limited to the embodiments described above, and various modifications can be made without departing from the spirit of the present invention.

EXPLANATION OF REFERENCES

10: product design device
11: consumer terminal
12: network
13: user terminal
21: design feature amount acquisition unit
23: search unit
25: output unit
27: product database
29: communication unit
31: product image
37: product attribute information
101: casing
102: touch panel display
103: operation button
104: speaker
105: built-in camera
106: external connection terminal
110: CPU
112: system bus
114: main memory
116: nonvolatile memory
118: mobile communication unit
118A: antenna
120: communication unit
120: wireless LAN communication unit
120A: antenna
122: near field wireless communication unit
122A: antenna
124: wired communication unit
126: display unit
128: input unit
130: key input unit
132: audio processing unit
134: image processing unit
step 10-step 14: process of product design assistance method
step 20-step 24: process of product design assistance method

What is claimed is:

1. A product design device, comprising:
a product database in which plurality of a first design feature amount related to appearance obtained by analyzing a first product image indicating a first product for each first product which has already been commercialized, and information on a sales record of the first product are registered in association with each other,
wherein the sales record of the first product includes at least one of site information indicating an EC site, brand information, stock information, size information, price information, a number of productions, a number of sales, sales store information, and a number of stock distributions; and a processor in a computer configured to:

analyze a second product image input by a user indicating a second product developed as a new product using a discriminator obtained by machine learning to acquire a second design feature amount related to appearance of the second product, wherein the first design feature amount and the second design feature amount include a sensitivity word converted from a physical measurement value using a conversion table;

search for the first product having the first design feature amount similar to the second design feature amount from the product database and acquire the information on the sales record of the first product that has been searched for, wherein a difference between the first design feature amount and the second design feature amount is less than a predetermined threshold and the predetermined threshold is determined according to a type of assistance of a design requested by the user or a number of search results; and statistically process product attribute information including at least one of the first design feature amount of the first product that has been searched for or the information on the sales record of the first product that has been searched for, and output the statistically processed product attribute information on a display, wherein the statistically processed product attribute information is selected by the user from at least one of the first design feature amount of the first product and the sales record of the first product.

2. The product design device according to claim 1, wherein the processor is further configured to statistically process the number of sales of the first product for each color of the first product and output a color with which the second product is to be produced or a proportion of the color with which the second product is to be produced.

3. The product design device according to claim 1, wherein the processor is further configured to statistically process the number of sales of the first product for each store of the first product and output a store to which the second product is to be delivered or a proportion of delivery to the store to which the second product is to be delivered.

4. The product design device according to claim 2, wherein the processor is further configured to statistically process the number of sales of the first product for each store of the first product and output a store to which the second product is to be delivered or a proportion of delivery to the store to which the second product is to be delivered.

5. The product design device according to claim 1, wherein the processor is further configured to statistically process the number of sales of the first product for each pattern of the first product and output a pattern with which the second product is to be produced or a proportion of the pattern with which the second product is to be produced.

6. The product design device according to claim 2, wherein the processor is further configured to statistically process the number of sales of the first product for each pattern of the first product and output a pattern with which the second product is to be produced or a proportion of the pattern with which the second product is to be produced.

7. The product design device according to claim 3, wherein the processor is further configured to statistically process the number of sales of the first product for each pattern of the first product and output a pattern with which the second product is to be produced or a proportion of the pattern with which the second product is to be produced.

8. The product design device according to claim 1, wherein the processor is further configured to statistically process the number of sales of the first product for each size of the first product and output a size with which the second product is to be produced or a proportion of the size with which the second product is to be produced.

9. The product design device according to claim 2, wherein the processor is further configured to statistically process the number of sales of the first product for each size of the first product and output a size with which the second product is to be produced or a proportion of the size with which the second product is to be produced.

10. The product design device according to claim 3, wherein the processor is further configured to statistically process the number of sales of the first product for each size of the first product and output a size with which the second product is to be produced or a proportion of the size with which the second product is to be produced.

11. The product design device according to claim 1, wherein the processor is further configured to statistically process the number of sales of the first product for each weave of the first product and output a weave with which the second product is to be produced or a proportion of the weave with which the second product is to be produced.

12. The product design device according to claim 2, wherein the processor is further configured to statistically process the number of sales of the first product for each weave of the first product and output a weave with which the second product is to be produced or a proportion of the weave with which the second product is to be produced.

13. The product design device according to claim 3, wherein the processor is further configured to statistically process the number of sales of the first product for each weave of the first product and output a weave with which the second product is to be produced or a proportion of the weave with which the second product is to be produced.

14. The product design device according to claim 1, wherein the first design feature amount and the second design feature amount include at least one of a color, a pattern, a shape, or a texture.

15. The product design device according to claim 2, wherein the first design feature amount and the second design feature amount include at least one of a color, a pattern, a shape, or a texture.

16. The product design device according to claim 1, wherein the information on the sales record of the first product relates to a same past season as a sales season scheduled for the second product.

17. The product design device according to claim 2, wherein the information on the sales record of the first product relates to a same past season as a sales season scheduled for the second product.

18. The product design device according to claim 1,
wherein the processor is further configured to:
search for a plurality of the first products having the first design feature amount similar to the second design feature amount from the product database, and acquire the information on the sales record of the plurality of first products that have been searched for, and statistically process product attribute information including at least one of the first design feature amount of the plurality of first products that have been searched for or information on the sales record of the plurality of first products that have been searched for, and output the statistically processed product attribute information.

19. The product design device according to claim 1, wherein the processor is further configured to:
- search for a plurality of the first products having the first design feature amount similar to the second design feature amount from the product database, and acquire the information on the sales record of the plurality of first products that have been searched for, and
- the output unit statistically processes statistically process product attribute information including at least one of the first design feature amount of the plurality of first products that have been searched for or information on the sales record of the plurality of first products that have been searched for, and output the statistically processed product attribute information.

20. The product design device according to claim 1, wherein the statistically processed product attribute information includes information that the sales store information, the number of productions, the number of stock distributions, and the number of sales are sorted by the first product.

21. A product design method using a product database in which plurality of a first design feature amount related to appearance obtained by analyzing a first product image indicating a first product for each first product which has already been commercialized and information on a sales record of the first product are registered in association with each other, wherein the sales record of the first product includes at least one of site information indicating an EC site, brand information, stock information, size information, price information, a number of productions, a number of sales, sales store information, and a number of stock distributions, the method comprising steps of:
- analyzing a second product image input by a user indicating a second product developed as a new product using a discriminator obtained by machine learning to acquire a second design feature amount related to appearance of the second product, wherein the first design feature amount and the second design feature amount include a sensitivity word converted from a physical measurement value using a conversion table;
- searching for the first product having the first design feature amount similar to the second design feature amount from the product database and acquiring the information on the sales record of the first product that has been searched for, wherein a difference between the first design feature amount and the second design feature amount is less than a predetermined threshold and the predetermined threshold is determined according to a type of assistance of a design requested by the user or a number of search results; and
- statistically processing product attribute information including at least one of the first design feature amount of the first product that has been searched for or the information on the sales record of the first product that has been searched for, and outputting the statistically processed product attribute information on a display, wherein the statistically processed product attribute information is selected by the user from at least one of the first design feature amount of the first product and the sales record of the first product.

* * * * *